(12) United States Patent
Mehrotra et al.

(10) Patent No.: US 11,777,002 B2
(45) Date of Patent: Oct. 3, 2023

(54) LATERALLY-DIFFUSED METAL-OXIDE SEMICONDUCTOR TRANSISTOR AND METHOD THEREFOR

(71) Applicant: NXP USA, INC., Austin, TX (US)

(72) Inventors: Saumitra Raj Mehrotra, Scottsdale, AZ (US); Bernhard Grote, Phoenix, AZ (US); Ljubo Radic, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 17/457,801

(22) Filed: Dec. 6, 2021

(65) Prior Publication Data

US 2022/0093752 A1    Mar. 24, 2022

Related U.S. Application Data

(62) Division of application No. 16/692,126, filed on Nov. 22, 2019, now Pat. No. 11,227,921.

(51) Int. Cl.
*H01L 29/40*    (2006.01)
*H01L 29/10*    (2006.01)
(Continued)

(52) U.S. Cl.
CPC .......... *H01L 29/402* (2013.01); *H01L 21/765* (2013.01); *H01L 29/1095* (2013.01);
(Continued)

(58) Field of Classification Search
CPC ............... H01L 29/808; H01L 29/0692; H01L 29/0634; H01L 29/7835; H01L 29/66901; H01L 29/1066; H01L 29/78; H01L 29/0615; H01L 29/0661; H01L 29/0623; H01L 29/0865; H01L 29/0886; H01L 29/41725; H01L 29/4238; H01L 29/0834;
(Continued)

(56) References Cited

U.S. PATENT DOCUMENTS 5,142,640 A    8/1992  Iwamatsu
5,640,034 A    6/1997  Malhi
(Continued)

OTHER PUBLICATIONS

Chil, M., Advanced 300mm 130nm BCD Technology from 5V to 85V with Deep-Trench Isolation, Proceedings from the 2016 28th International Symposium on Power Semiconductor Devices and ICs (ISPSD), Jun. 12-16, 2016.
(Continued)

*Primary Examiner* — Natalia A Gondarenko (57) ABSTRACT

A transistor includes a trench formed in a semiconductor substrate with the trench having a first sidewall and a second sidewall. A gate region includes a conductive material filled in the trench. A drift region having a first conductivity type is formed in the semiconductor substrate adjacent to the second sidewall. A drain region is formed in the drift region and separated from the second sidewall by a first distance. A dielectric layer is formed at the top surface of the semiconductor substrate covering the gate region and the drift region between the second sidewall and the drain region. A field plate is formed over the dielectric layer and isolated from the conductive material and the drift region by way of the dielectric layer.

20 Claims, 9 Drawing Sheets

(51) Int. Cl.
*H01L 29/45* (2006.01)
*H01L 29/66* (2006.01)
*H01L 21/765* (2006.01)
*H01L 29/78* (2006.01)

(52) U.S. Cl.
CPC ............ *H01L 29/45* (2013.01); *H01L 29/665* (2013.01); *H01L 29/66704* (2013.01); *H01L 29/7825* (2013.01)

(58) Field of Classification Search
CPC . H01L 29/73; H01L 29/8086; H01L 29/0843; H01L 29/0882; H01L 29/1083; H01L 29/41758; H01L 29/42316; H01L 29/6606; H01L 29/66893; H01L 29/66568; H01L 29/66674; H01L 29/7811; H01L 29/0619; H01L 29/0649; H01L 29/0653; H01L 29/0696; H01L 29/7832; H01L 29/0847; H01L 29/66659; H01L 29/7838; H01L 2924/13091; H01L 2924/1305; H01L 2924/13055; H01L 2924/13062; H01L 27/0259; H01L 27/0266; H01L 27/0623; H01L 27/098; H01L 27/0617; H01L 29/1095; H01L 29/45; H01L 29/402; H01L 29/665; H01L 29/7825; H01L 29/4236; H01L 29/66613–66628; H01L 29/66681–66704; H01L 29/7816–7826; H01L 29/70; H01L 29/7424; H01L 29/7801; H01L 29/7809; H01L 29/80
USPC ....... 257/339, 335, 336, 343, 369, 408, 409, 257/481, 104, 493, 548
See application file for complete search history.

(56) References Cited

U.S. PATENT DOCUMENTS

| | | | |
|---|---|---|---|
| 6,552,389 B2 | 4/2003 | Yasuhara et al. | |
| 7,033,891 B2 | 4/2006 | Wilson et al. | |
| 7,301,201 B2 | 11/2007 | Hwang | |
| 7,719,076 B2 | 5/2010 | Shu et al. | |
| 8,198,677 B2 | 6/2012 | Wilson et al. | |
| 8,350,327 B2 | 1/2013 | Chung et al. | |
| 9,818,862 B2 | 11/2017 | Gao et al. | |
| 10,424,646 B2 | 9/2019 | Mehrotra et al. | |
| 2008/0067585 A1 | 3/2008 | Williams et al. | |
| 2008/0237704 A1* | 10/2008 | Williams | ............ H01L 29/7835 257/E21.546 |
| 2013/0020632 A1 | 1/2013 | Disney | |
| 2014/0021534 A1* | 1/2014 | Verma | ............... H01L 21/82385 438/270 |
| 2014/0151758 A1* | 6/2014 | Meiser | ................ H01L 29/0634 438/270 |
| 2015/0048447 A1 | 2/2015 | Sharma et al. | |
| 2016/0211348 A1 | 7/2016 | Yoshida | |
| 2017/0104097 A1 | 4/2017 | Park | |
| 2019/0097045 A1 | 3/2019 | Grote et al. | |
| 2019/0097046 A1 | 3/2019 | Mehrotra et al. | |

OTHER PUBLICATIONS

Huang, T., "0.18um BCD Technology with Best-in-Class LDMOS from 6 V to 45 V", Proceedings of the 26th International Symposium on Power Semiconductor Devices & IC's, Jun. 15-19, 2014.
Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa, 2013.
Yang, H., "Low-Leakage SMARTMOS 10W Technology at 0.13um Node with Optimized Analog, Power and Logic Devices for SOC Design", IEEE 2008.

* cited by examiner

FIG. 9

LATERALLY-DIFFUSED METAL-OXIDE SEMICONDUCTOR TRANSISTOR AND METHOD THEREFOR This application is a divisional application of a U.S. patent application entitled "LATERALLY-DIFFUSED METAL-OXIDE SEMICONDUCTOR TRANSISTOR AND METHOD THEREFOR", having a serial number of Ser. No. 16/692,126, having a filing date of Nov. 22, 2019, having common inventors, and having a common assignee, all of which is incorporated by reference in its entirety.

BACKGROUND

Field

This disclosure relates generally to semiconductor devices, and more specifically, to laterally-diffused metal-oxide semiconductor (LDMOS) transistors and method of forming the same.

Related Art

Traditional semiconductor devices and semiconductor device fabrication processes are evolving. For example, metal oxide semiconductor field-effect transistors (MOSFETs) are used in a variety of different applications and electronic products—from sewing machines to washing machines, from automobiles to cellular telephones, and so on. As process technology progresses, these semiconductor devices are expected to reduce in size and cost while increasing performance. However, challenges exist in balancing size, cost, and performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In recent years, automotive, industrial, and consumer applications have had increasing demands on smart power technologies which integrate digital, analog, and high-voltage power transistors on a single chip aimed to lower manufacturing costs. In semiconductor manufacturing, silicon area is at a premium. Desirable improved on-resistance*area (RonA) values of power transistors with reduced silicon area impact is one example of technological improvement occurring in a trench-based transistor as described herein.

Generally, there is provided, a trench-based laterally-diffused metal-oxide semiconductor (LDMOS) transistor. A trench formed in a semiconductor substrate is filled with a conductive material to form a gate region. A gate dielectric is formed as a liner in the trench isolating the gate region from the substrate. A source region is formed at the surface of the semiconductor substrate adjacent to the trench. A drain region is formed at the surface of the semiconductor substrate separated from the trench by a predetermined distance. A dielectric layer is formed over the gate region and spans the predetermined distance over a drift region between the trench and the drain region. A field plate is formed over a portion of the dielectric layer. The field plate and dielectric layer have dimensions chosen to achieve higher breakdown voltages and improved RonA.

FIG. 1 through FIG. 7 illustrate, in simplified cross-sectional views, various stages of manufacture of an example laterally-diffused metal-oxide semiconductor (LDMOS) transistor 100 formed in accordance with an embodiment.

Figure 1:
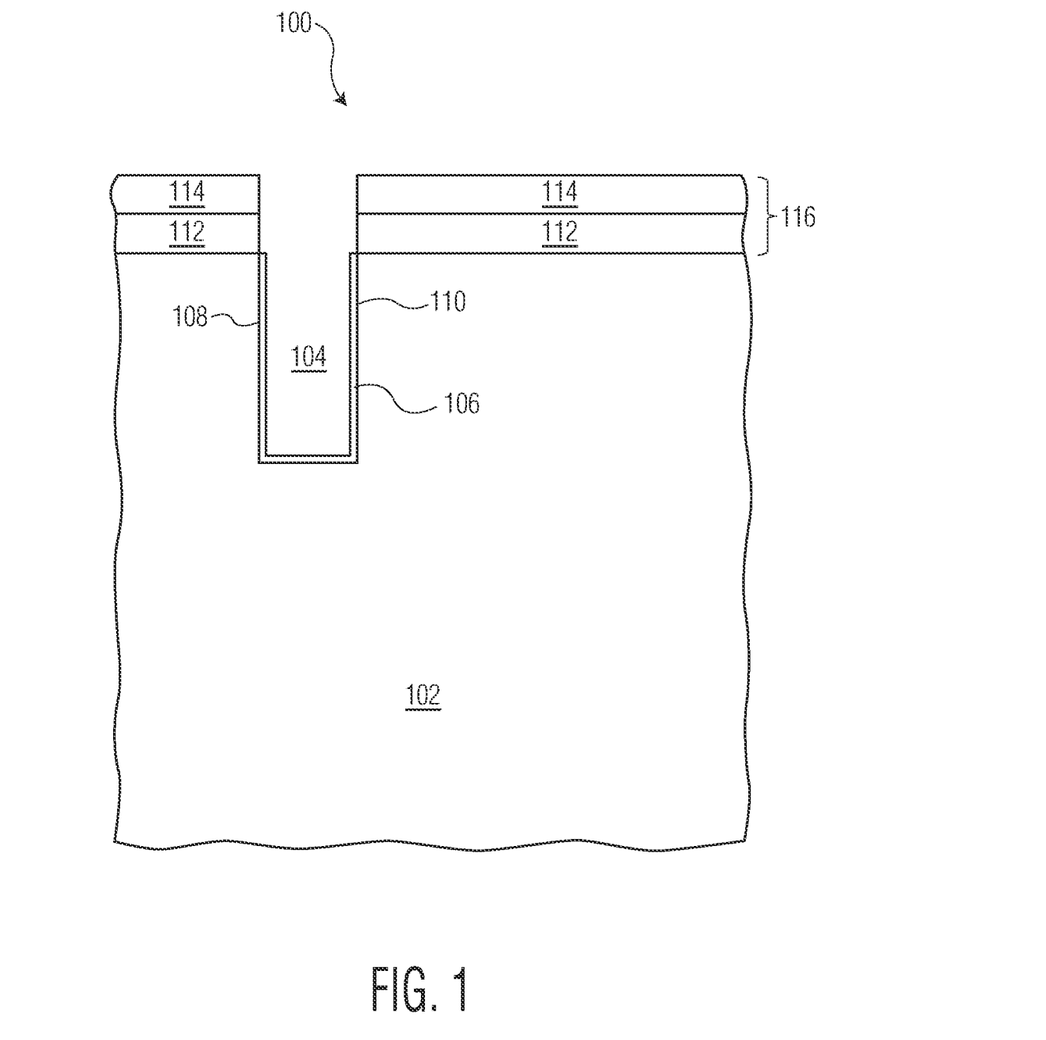
FIG. 1 through FIG. 7 illustrate, in simplified cross-sectional views, various stages of manufacture of an example laterally-diffused metal-oxide semiconductor (LDMOS) transistor in accordance with an embodiment.

FIG. 1 illustrates in a simplified cross-sectional view, example LDMOS transistor 100 at a stage of manufacture in accordance with an embodiment. At this stage, transistor 100 includes a silicon-based substrate 102, a patterned hard mask 116 formed over the substrate 102, a trench 104 formed in the substrate 102, and a gate dielectric 106 formed at the sidewalls and bottom of the trench 104. In this embodiment, the substrate 102 is formed as a P-type doped silicon substrate having a P-type conductivity type. Substrate 102 may be formed as a P-type doped silicon substrate having an N-type epitaxial layer. Substrate 102 may alternatively be formed from other suitable silicon-based substrates such as gallium arsenide, silicon germanium, silicon-on-insulator (SOI), silicon, monocrystalline silicon, the like, and combinations thereof, for example.

In this embodiment, an oxide layer 112 is formed on the on substrate 102, and a nitride layer 114 is formed on the oxide layer 112. The nitride/oxide layers together are patterned to form hard mask 116. In other embodiments, other suitable materials and combinations thereof may be used to form hard mask 116. In this embodiment, the trench 104 includes a first sidewall 108, a second sidewall 110, and a bottom surface. Etch techniques such as reactive ion etching (RIE) may be employed to form trench 104, for example. In this embodiment, the gate dielectric 106 is formed on exposed surfaces of trench 104 essentially forming a liner layer at sidewalls 108-110 and bottom surfaces of trench 104. The gate dielectric 106 may be formed from any suitable gate dielectric material (e.g., silicon dioxide). The gate dielectric 106 may be formed as a grown layer, deposited layer, or combination thereof.

Figure 2:
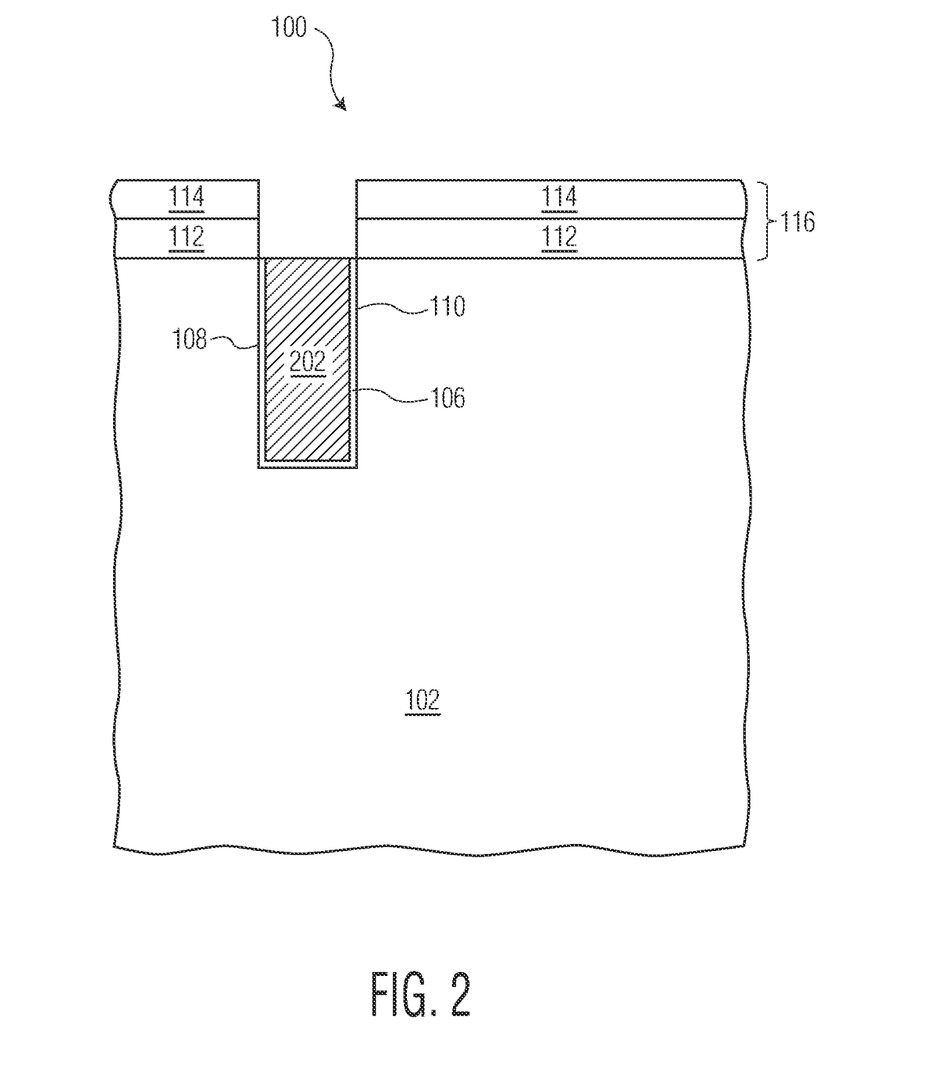

FIG. 2 illustrates in a simplified cross-sectional view, example LDMOS transistor 100 at a subsequent stage of manufacture in accordance with an embodiment. At this stage, a conductive material is deposited to substantially fill trench 104 and to form a gate region 202. A planarization operation is performed to level the conductive material with 114 layer. In this embodiment, the planarization operation may include a chemical-mechanical planarization (CMP) process. In other embodiments, the planarization operation may include a wet etch process. A subsequent etch operation may be performed to substantially level the conductive material with the top surface of the substrate to form the gate region 202. The gate region 202 may be formed from a suitable conductive material such as a polysilicon material or a metal material, for example. In this embodiment, the gate region 202 is configured and arranged to serve as a gate electrode for the example LDMOS transistor 100. In other embodiments, the gate region 202 may be formed from other conductive materials.

Figure 3:
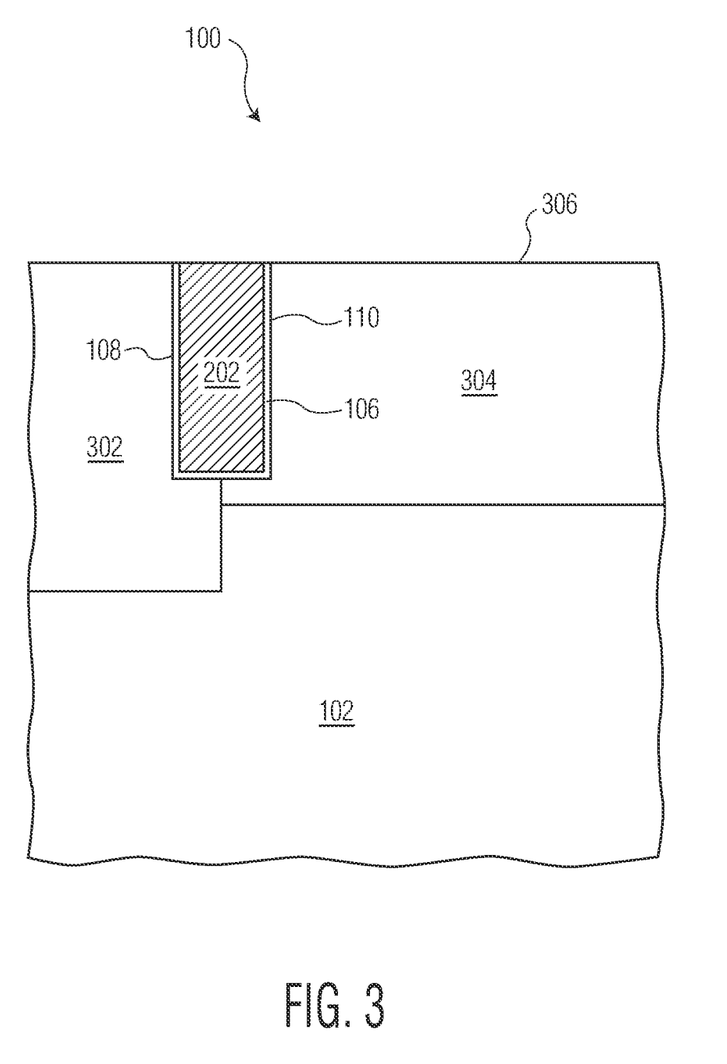

FIG. 3 illustrates in a simplified cross-sectional view, example LDMOS transistor 100 at a subsequent stage of manufacture in accordance with an embodiment. At this stage, a planar top surface 306 of substrate 102 is formed, and body region 302 and drift region 304 are formed.

In the embodiment depicted in FIG. 3, the hard mask 116 at the top surface of the substrate 102 is removed forming the planar top surface 306. In this embodiment, the gate region 202 is substantially planar with the planar top surface 306. In other embodiments, the gate region 202 may be slightly recessed or slightly protruding from the planar top surface 306. The gate dielectric 106 remaining in the trench serves to isolate the gate region 202 from the substrate 102.

In this embodiment, body region 302 is formed as a P-type well dopant implanted region in substrate 102, adjacent to sidewall 108. The body region 302 may be characterized as a P− (minus) body region. Drift region 304 is formed as an N-type well dopant implanted region in substrate 102, adjacent to sidewall 110. The drift region 304 may be characterized as a N− (minus) drift region. In some embodiments, the drift region 304 may be formed from an N-type epitaxial layer of substrate 102.

Figure 4:
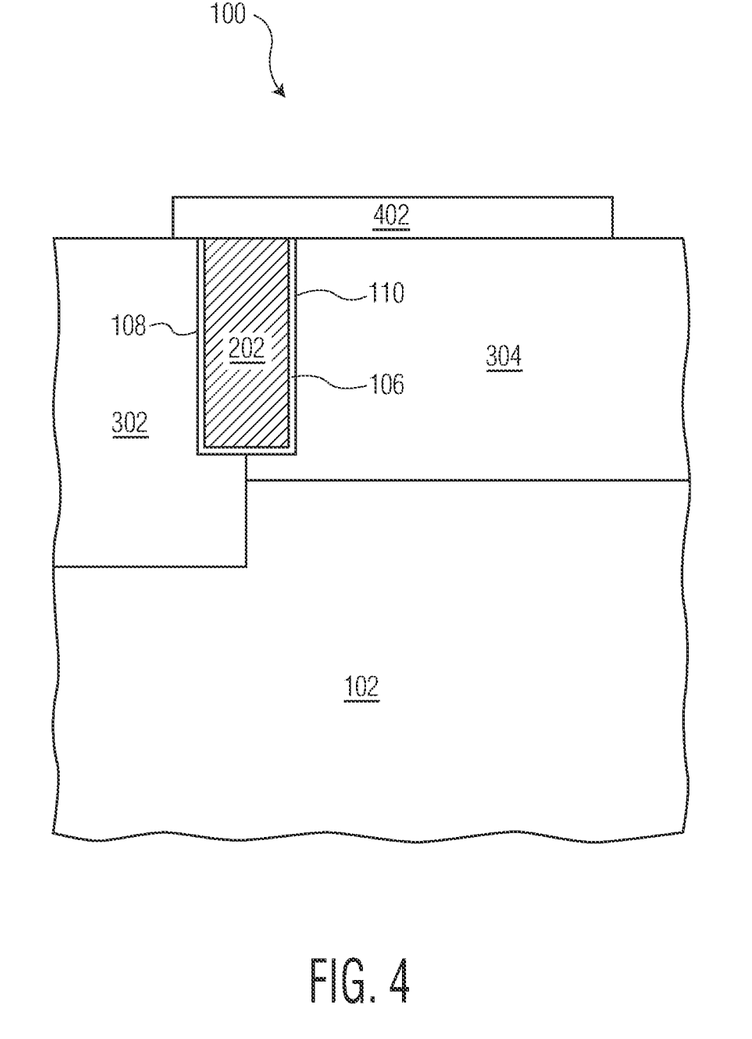

FIG. 4 illustrates in a simplified cross-sectional view, example LDMOS transistor 100 at a subsequent stage of manufacture in accordance with an embodiment. At this stage, a dielectric layer 402 is formed at the top surface of substrate 102. Dielectric layer 402 formed at the top surface of the substrate 102 is deposited and patterned to cover the gate region 202 and portions of the body and drift regions 302 and 304. In this embodiment, dielectric layer 402 may be formed from a dielectric material (e.g., silicon nitride) suitable for serving as a self-aligned mask when forming subsequent process structures (e.g., source/drain regions, salicide layer). Dimensions (e.g., thickness, width, length) of the dielectric layer 402 may be chosen for optimal reduced surface field (RESURF).

Figure 5:
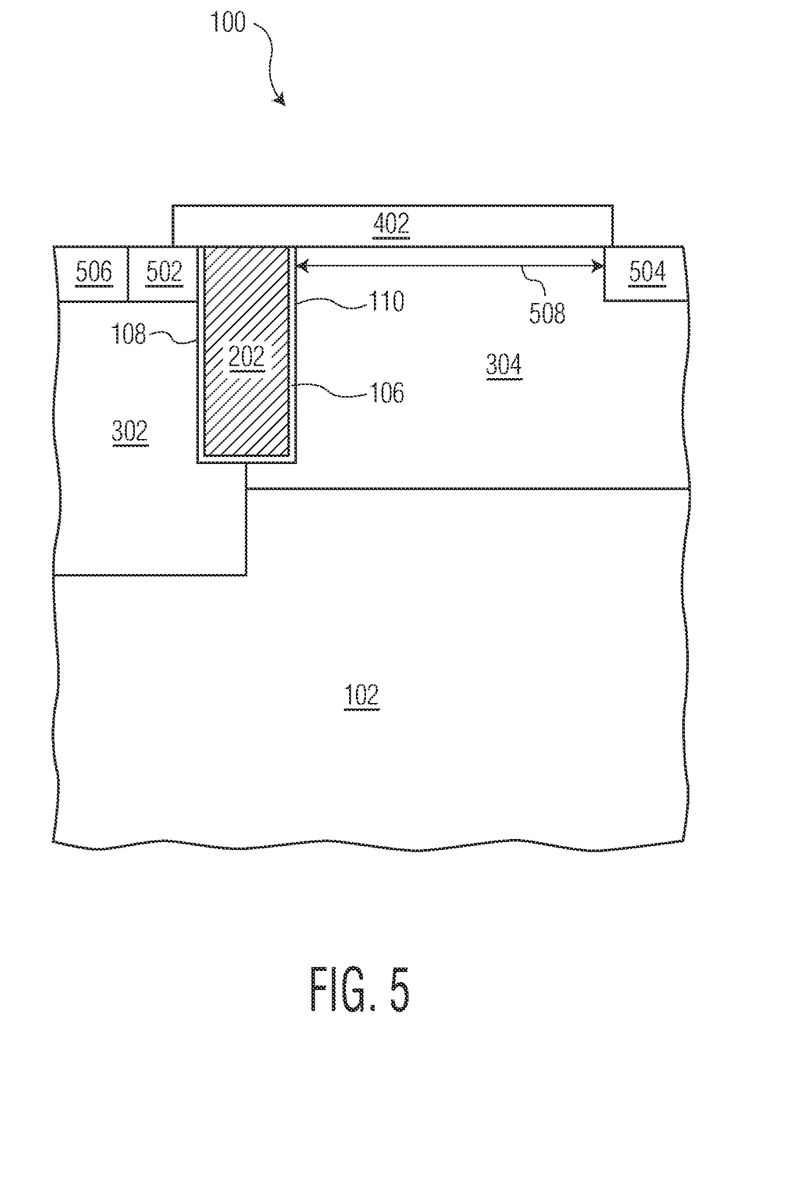

FIG. 5 illustrates in a simplified cross-sectional view, example LDMOS transistor 100 at a subsequent stage of manufacture in accordance with an embodiment. At this stage, source and drain regions 502 and 504 are formed, and body tie region 506 is formed. After body region 302 and drift region 304 are formed, N-type dopants are implanted to form source and drain regions 502 and 504 respectively. Source and drain regions 502 and 504 may be characterized as N+ (plus) source/drain regions, respectively. Source region 502 is formed adjacent to sidewall 108 and P-type dopant is implanted to form body tie region 506 allowing electrical connectivity with body region 302. Body tie region 506 may be characterized as a P+ (plus) body tie region. In this embodiment, body tie region 506 abuts source region 502. Drain region 504 is formed separate from sidewall 110 by a lateral distance 508. As the lateral distance 508 increases, corresponding breakdown voltages increase. In this embodiment, the lateral distance 508 between the sidewall 110 and drain region 504 may be in range of 0.5 microns to 10.0 microns, for example. In some embodiments, the lateral distance 508 may be less than 0.5 microns or greater than 10.0 microns.

Figure 6:
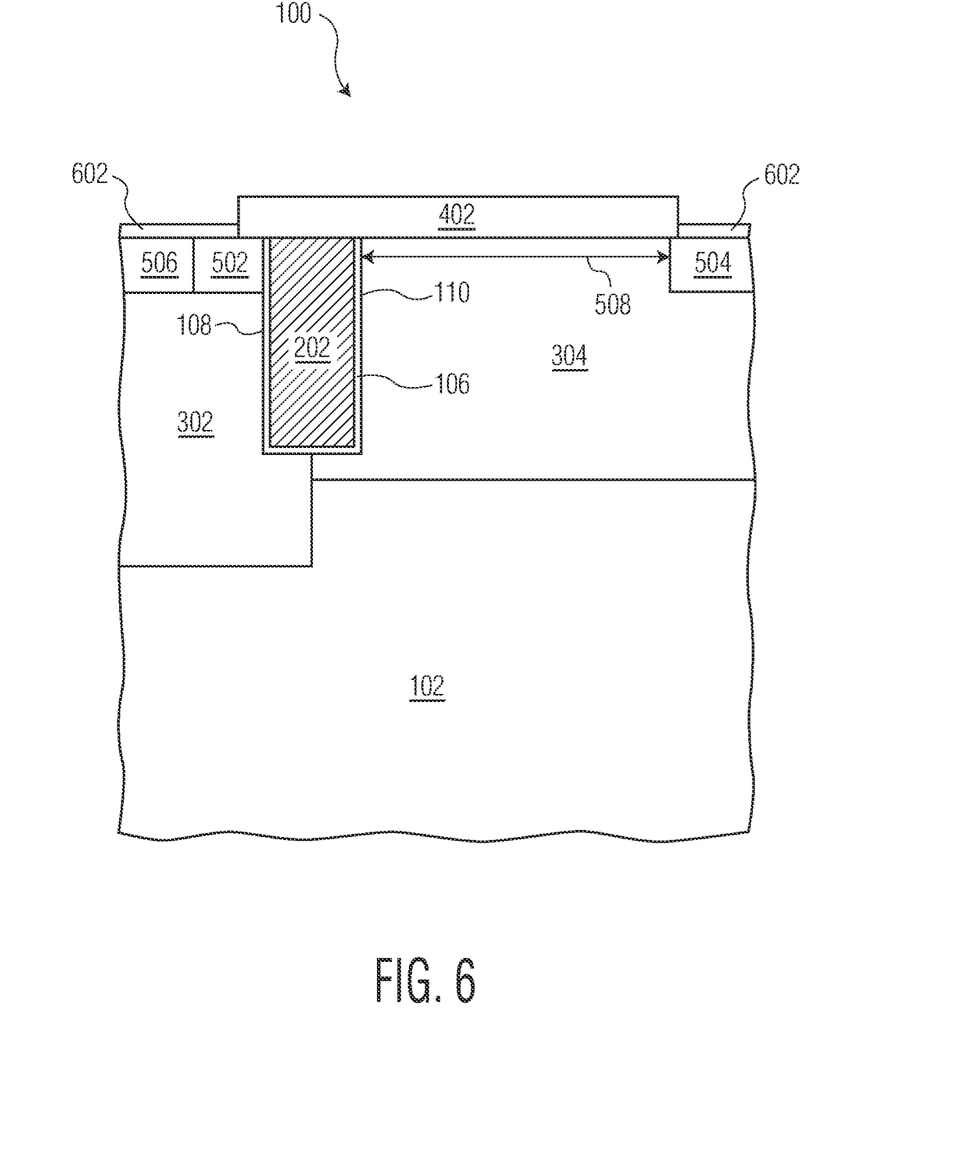

FIG. 6 illustrates in a simplified cross-sectional view, example LDMOS transistor 100 at a subsequent stage of manufacture in accordance with an embodiment. At this stage, salicide regions 602 are formed at a top surface of source and drain regions 502 and 504, and body tie region 506. A metal thin film layer (e.g., titanium, platinum, tungsten) is deposited and reacted with the exposed top surface of the source and drain regions 502 and 504, and body tie region 506 to form the salicide regions 602. The salicide regions serve to form a high conductivity contact region at the top surface of source and drain regions 502 and 504 and body tie region 506. In this embodiment, the term salicide as used herein may also refer to self-aligned silicide.

Figure 7:
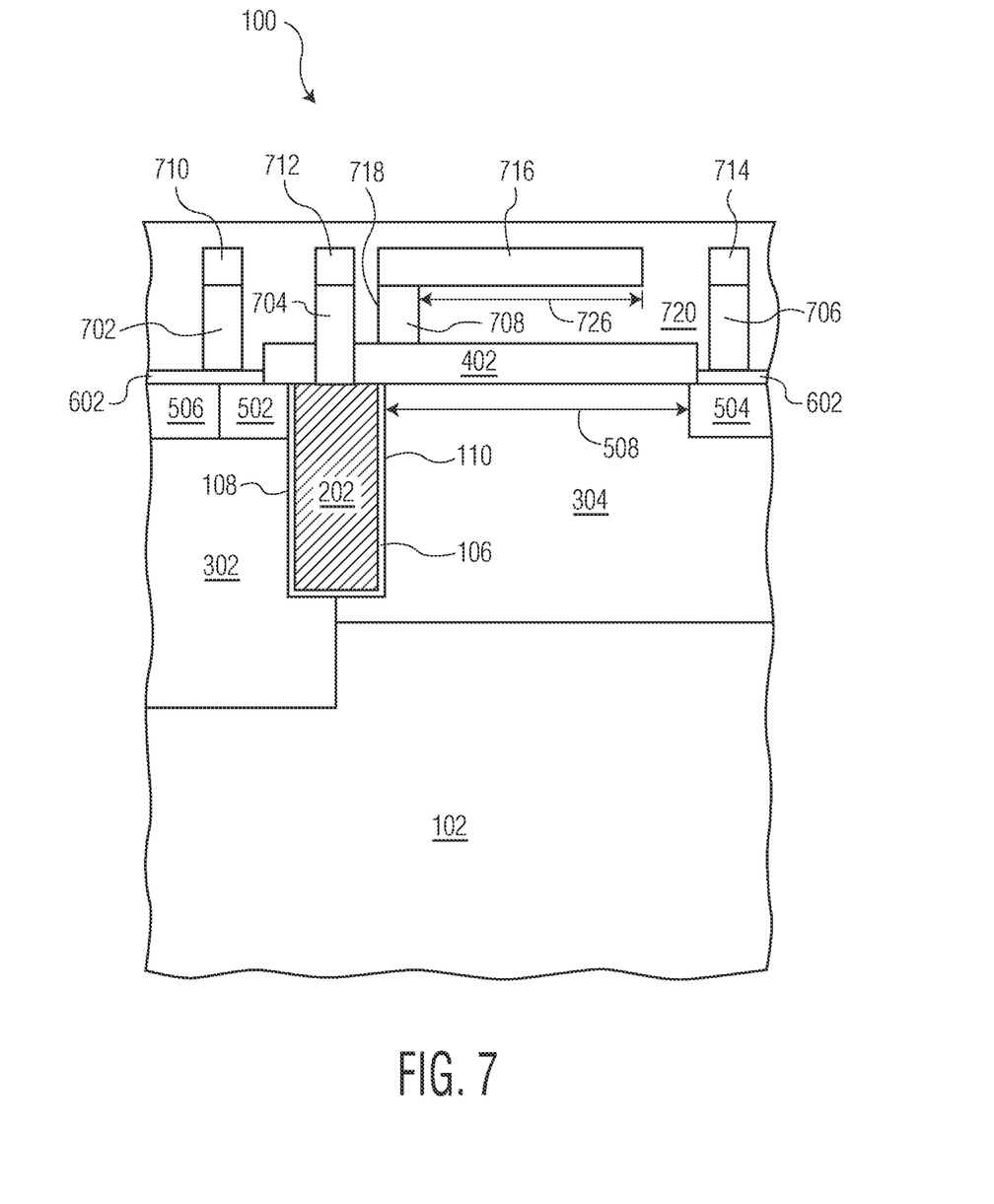

FIG. 7 illustrates in a simplified cross-sectional view, example LDMOS transistor 100 at a subsequent stage of manufacture in accordance with an embodiment. At this stage, the example LDMOS transistor 100 includes contacts 702-708, electrode terminals 710-714, and horizontal field plate 716. In this embodiment, horizontal field plate 716 and contact 708 together form a pseudo L-shaped field plate as depicted in FIG. 7.

In this embodiment, an inter-level dielectric (ILD) region 720 is formed over the dielectric layer 402 and the salicide regions 602. The ILD region 720 may be formed from a series of deposited oxide layers such as tetraethyl orthosilicate (TEOS). For example, a first oxide layer of ILD region 720 may be deposited, patterned, and etched to expose portions of gate region 202, salicide regions 602, and dielectric layer 402. After the first oxide layer is patterned and etched, contacts 702-708 are formed. Contacts 702-708 may be formed from any suitable conductive material such as copper, gold, silver, aluminum, nickel, tungsten, and alloys thereof, for example. Contacts 702-706 provide a conductive connection to the source and body tie regions 502 and 506, gate region 202, and drain region 504 respectively. Contact 708 is formed such that a bottom surface of the contact 708 abuts a top surface of the dielectric layer 402. In this embodiment, contact 708 serves as a vertical field plate portion having a first edge 718 overlapping a portion of the gate region 202 at sidewall 110.

After the contacts 702-708 are formed, a conductive layer is deposited, patterned, and etched to form electrode terminals 710-714, and horizontal field plate 716. The electrode terminals 710-714 and the horizontal field plate 716 may be formed from any suitable conductive material such as copper, gold, silver, aluminum, nickel, tungsten, and alloys thereof, for example. In this embodiment, source electrode terminal 710 is connected to source and body tie regions 502 and 506 by way of contact 702 and salicide region 602, gate electrode terminal 712 is connected to the gate regions 202 by way of contact 704, and drain electrode terminal 714 is connected to drain region 504 by way of contact 706 and salicide region 602.

Horizontal field plate 716 is directly connected to contact 708 forming the pseudo L-shaped field plate. A portion of horizontal field plate 716 overlaps the underlying drift region 304 between the gate region 202 and drain region 504 by an overlap distance 726. The overlap distance 726 may be chosen for optimal RESURF. In this embodiment, the overlap distance 726 may be in a range of 40% to 60% of the lateral distance 508, for example. In some embodiments, the overlap distance 726 may be less than 40% or greater than 60% of the lateral distance 508. In this embodiment, the field plate is electrically isolated from the substrate by way of the dielectric layer 402. In some embodiments, the field plate may be connected to the source electrode terminal 710 or the gate electrode terminal 712 by way of a metal interconnect layer, for example.

In the embodiment depicted in FIG. 7, the electrode terminals 710-714 and the horizontal field plate 716 are formed from a same conductive layer. In other embodiments, the electrode terminals 710-714 and the horizontal field plate 716 may be formed from different conductive layers. After the electrode terminals 710-714 and the horizontal field plate 716 are formed, a subsequent oxide layer (e.g., TEOS) of ILD region 720 may be deposited to cover exposed surfaces of the electrode terminals 710-714, the horizontal field plate 716, and first oxide layer.

Figure 8:
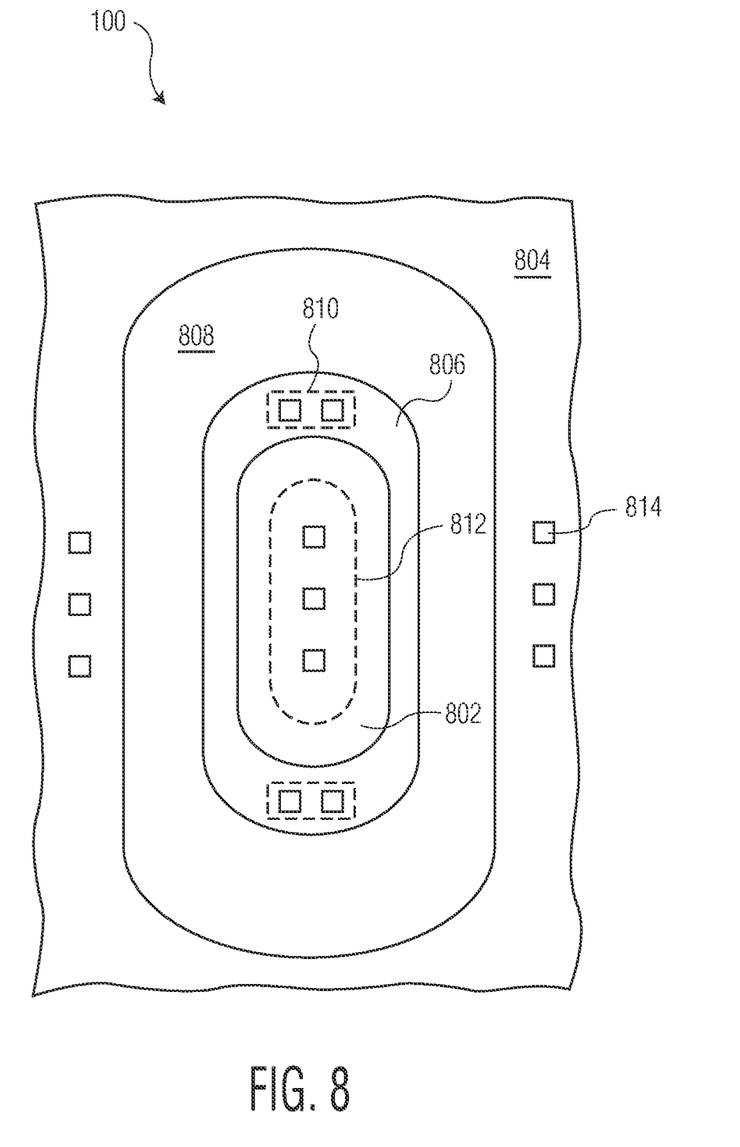
FIG. 8 and FIG. 9 illustrate, in simplified plan views, the example LDMOS transistor at a stage of manufacture in accordance with an embodiment.

FIG. 8 illustrates, in a simplified plan view, the example LDMOS transistor 100 at a stage of manufacture in accordance with an embodiment. In the embodiment depicted in FIG. 8, the LDMOS transistor 100 is formed as an oval shaped transistor with source region 802, drain region 804, gate region 806, and dielectric layer 808 corresponding, respectively, to the source region 502, drain region 504, gate region 202, and dielectric layer 402 of FIG. 7. The dielectric layer 808 is shown as a transparent region allowing underlying details to be visible. In this embodiment, source region 802 is surrounded by gate region 806. Drain region 804 is formed separate from the gate region 806 and surrounds the gate region 806 at the lateral distance 508 as depicted in FIG. 7. Dielectric layer 808 is formed covering cover the gate region 806, portions of the source and drain regions 802 and 804, and the drift region (not shown) between the gate region 806 and the drain region 804. The dashed outlined areas 810 and 812 depict openings in the dielectric layer 808. Example contacts 814 provide connections to source, drain, and gate regions 802-806, for example. Features such as the electrode terminals and field plate are not shown.

Figure 9:
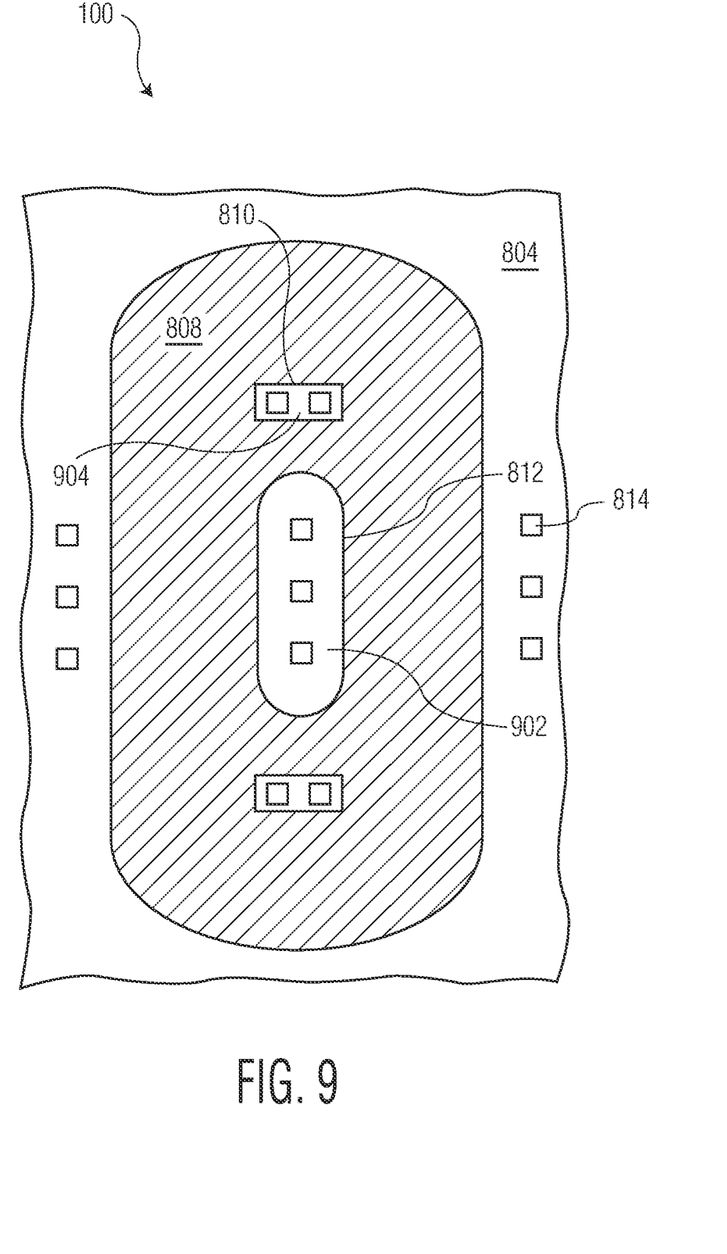

FIG. 9 illustrates, in a simplified plan view, the example LDMOS transistor 100 at a stage of manufacture in accordance with an embodiment. In the embodiment depicted in FIG. 9, the LDMOS transistor 100 of FIG. 8 is shown with dielectric layer 808 as an opaque (shaded) region preventing underlying details to be visible. In this embodiment, a source region portion 902 is visible through opening 812 of dielectric layer 808 and gate region portions 904 are visible through openings 810 of dielectric layer 808.

Generally, there is provided, a transistor including a trench formed in a semiconductor substrate, the trench having a first sidewall and a second sidewall; a gate region comprising a conductive material filled in the trench; a drift region formed in the semiconductor substrate adjacent to the second sidewall, the drift region having a first conductivity type; a drain region formed in the drift region, the drain region separated from the second sidewall by a first distance; a dielectric layer formed at the top surface of the semiconductor substrate covering the gate region and the drift region between the second sidewall and the drain region; and a field plate formed over the dielectric layer, the field plate isolated from the conductive material and the drift region by way of the dielectric layer. A first edge of the field plate may overlap a portion of the gate region and a second edge of the field plate may extend a second distance over the drift region, the second distance less than the first distance. The field plate may include a horizontal portion and a vertical portion, the horizontal portion separated from the dielectric layer by an interlayer dielectric (ILD), and the vertical portion contacted to the horizontal portion proximate to the first edge and extends from a bottom surface of the horizontal portion to a top surface of the dielectric layer. The transistor may further include a gate dielectric disposed at sidewalls and bottom of the trench, the gate dielectric isolating the conductive material from the semiconductor substrate. The conductive material may be formed from a polysilicon material and the field plate may be formed from a metal material. The transistor may further include a source region formed in the semiconductor substrate adjacent to the first sidewall, a portion of the dielectric layer overlapping the source region. The transistor may further include a body region having a second conductivity type formed in the semiconductor substrate adjacent to the first sidewall, the source region formed in the body region. The transistor may further include a salicide layer formed at the top surface of the drain region and the source region, and wherein the dielectric layer is formed from nitride material and is configured to serve as a mask for the salicide layer. The transistor may further include a source terminal contacted to the source region, the source terminal connected to the field plate by way of a metal layer.

In another embodiment, there is provided, a method including etching a trench in a semiconductor substrate, the trench having a first sidewall and a second sidewall; filling the trench with a conductive material to form a gate region; forming a drift region in the semiconductor substrate adjacent to the second sidewall, the drift region having a first conductivity type; forming a drain region in the drift region, the drain region separated from the second sidewall by a first distance; patterning a dielectric layer at the top surface of the semiconductor substrate to cover the gate region and the drift region between the second sidewall and the drain region; and forming a field plate over the dielectric layer, the field plate isolated from the conductive material and the drift region by way of the dielectric layer. A first edge of the field plate may overlap a portion of the gate region and a second edge of the field plate may extend a second distance over the drift region, the second distance less than the first distance. The conductive material may be formed from a polysilicon material and the field plate may be formed from a metal material. Forming the field plate may include forming a vertical portion having a bottom surface contacting a top surface of the dielectric layer and a top surface extending through an interlayer dielectric (ILD); and forming a horizontal portion contacting a top surface of the vertical portion, the horizontal portion separated from the dielectric layer by the ILD. The method may further include forming a gate dielectric at sidewalls and bottom of the trench before filling the trench with the conductive material, the gate dielectric isolating the conductive material from the semiconductor substrate. The method may further include forming a source region in the semiconductor substrate adjacent to the first sidewall, a portion of the dielectric layer overlaps the source region. The method may further include forming a body region having a second conductivity type in the semiconductor substrate adjacent to the first sidewall, the source region formed in the body region. The method may further include forming a gate terminal contacted to the gate region, and connecting the gate terminal to the field plate by way of a metal layer.

In yet another embodiment, there is provided, a transistor including a trench formed in a semiconductor substrate, the trench having a first sidewall and a second sidewall; a gate region including a conductive material filled in the trench; a gate dielectric disposed at sidewalls and bottom of the trench, the gate dielectric isolating the conductive material from the semiconductor substrate; a drift region formed in the semiconductor substrate adjacent to the second sidewall, the drift region having a first conductivity type; a drain region formed in the drift region, the drain region separated from the second sidewall by a first distance; a body region formed in the semiconductor substrate adjacent to the first sidewall, the body region having a second conductivity type; a dielectric layer formed at the top surface of the semiconductor substrate covering the gate region and the drift region between the second sidewall and the drain region; and a field plate formed over the dielectric layer, the field plate isolated from the conductive material and the drift region by way of the dielectric layer. A first edge of the field plate may overlap a portion of the gate region and a second edge of the field plate may extend a second distance over the drift region, the second distance less than the first distance. The transistor may further include a source region having the first conductivity type formed in the body region adjacent to the first sidewall, a portion of the dielectric layer overlapping the source region.

By now it should be appreciated that there has been provided a trench-based LDMOS transistor. A trench formed in a semiconductor substrate is filled with a conductive material to form a gate region. A gate dielectric is formed as a liner in the trench isolating the gate region from the substrate. A source region is formed at the surface of the semiconductor substrate adjacent to the trench. A drain region is formed at the surface of the semiconductor substrate separated from the trench by a predetermined distance. A dielectric layer is formed over the gate region and spans the predetermined distance over a drift region between the trench and the drain region. A field plate is formed over a portion of the dielectric layer. The field plate and dielectric layer have dimensions chosen to achieve higher breakdown voltages and improved RonA.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
   etching a trench in a semiconductor substrate, the trench having a first sidewall and a second sidewall;
   filling the trench with a conductive material to form a gate region;
   forming a drift region in the semiconductor substrate adjacent to the second sidewall, the drift region having a first conductivity type;
   forming a drain region in the drift region, the drain region separated from the second sidewall by a first distance;
   patterning a dielectric layer at a top surface of the semiconductor substrate to cover the gate region and the drift region between the second sidewall and the drain region; and
   forming a field plate over the dielectric layer, the field plate isolated from the conductive material and the drift region by way of the dielectric layer and a first edge of the field plate overlapping a portion of the gate region.

2. The method of claim 1, wherein a second edge of the field plate extends a second distance over the drift region, the second distance less than the first distance.

3. The method of claim 1, wherein the conductive material is formed from a polysilicon material and the field plate is formed from a metal material.

4. The method of claim 1, wherein forming the field plate comprises:
   forming a vertical portion having a bottom surface contacting a top surface of the dielectric layer and a top surface of the vertical portion extending through an interlayer dielectric (ILD); and
   forming a horizontal portion contacting a top surface of the vertical portion, the horizontal portion separated from the dielectric layer by the ILD.

5. The method of claim 1, further comprising forming a gate dielectric at sidewalls and bottom of the trench before filling the trench with the conductive material, the gate dielectric isolating the conductive material from the semiconductor substrate.

6. The method of claim 1, further comprises forming a source region in the semiconductor substrate adjacent to the first sidewall, a portion of the dielectric layer overlaps the source region.

7. The method of claim 6, further comprises forming a body region having a second conductivity type in the semiconductor substrate adjacent to the first sidewall, the source region formed in the body region.

8. The method of claim 1, further comprises forming a gate terminal contacted to the gate region, and connecting the gate terminal to the field plate by way of a metal layer.

9. A method comprising:
   etching a trench in a semiconductor substrate, the trench having a first sidewall and a second sidewall;
   filling the trench with a conductive material to form a gate region;
   forming a source region in the semiconductor substrate adjacent to the first sidewall, the source region surrounded by the gate region;
   forming a drift region in the semiconductor substrate adjacent to the second sidewall, the drift region having a first conductivity type;
   forming a drain region in the drift region, the drain region separated from the second sidewall by a first distance;
   patterning a dielectric layer at a top surface of the semiconductor substrate to cover the gate region and the drift region between the second sidewall and the drain region; and
   forming a field plate over the dielectric layer, the field plate isolated from the conductive material and the drift region by way of the dielectric layer and a first edge of the field plate overlapping a portion of the gate region.

10. The method of claim 9, wherein a second edge of the field plate extends a second distance over the drift region, the second distance less than the first distance.

11. The method of claim 9, wherein the conductive material is formed from a polysilicon material and the field plate is formed from a metal material.

12. The method of claim 9, wherein forming the field plate comprises:
   forming a vertical portion having a bottom surface contacting a top surface of the dielectric layer and a top surface of the vertical portion extending through an interlayer dielectric (ILD); and
   forming a horizontal portion contacting a top surface of the vertical portion, the horizontal portion separated from the dielectric layer by the ILD.

13. The method of claim 9, further comprising forming a gate dielectric at sidewalls and bottom of the trench before filling the trench with the conductive material, the gate dielectric isolating the conductive material from the semiconductor substrate.

14. The method of claim 9, wherein a portion of the dielectric layer overlaps the source region.

15. The method of claim 9, further comprises forming a body region having a second conductivity type in the semiconductor substrate adjacent to the first sidewall, the source region formed in the body region.

16. The method of claim 9, further comprises forming a gate terminal contacted to the gate region, and connecting the gate terminal to the field plate by way of a metal layer.

17. A method comprising:
 etching a trench in a semiconductor substrate, the trench having a first sidewall and a second sidewall;
 filling the trench with a conductive material to form a gate region;
 forming a source region in the semiconductor substrate adjacent to the first sidewall, the source region surrounded by the gate region;
 forming a drift region in the semiconductor substrate adjacent to the second sidewall, the drift region having a first conductivity type;
 forming a drain region in the drift region, the drain region separated from the second sidewall by a first distance;
 forming a body region having a second conductivity type in the semiconductor substrate adjacent to the first sidewall, the source region formed in the body region;
 patterning a dielectric layer at a top surface of the semiconductor substrate to cover the gate region and the drift region between the second sidewall and the drain region; and
 forming a field plate over the dielectric layer, the field plate isolated from the conductive material and the drift region by way of the dielectric layer and a first edge of the field plate overlapping a portion of the gate region.

18. The method of claim 17, wherein a second edge of the field plate extends a second distance over the drift region, the second distance less than the first distance.

19. The method of claim 17, wherein forming the field plate comprises:
 forming a vertical portion having a bottom surface contacting a top surface of the dielectric layer and a top surface of the vertical portion extending through an interlayer dielectric (ILD); and
 forming a horizontal portion contacting a top surface of the vertical portion, the horizontal portion separated from the dielectric layer by the ILD.

20. The method of claim 17, further comprising forming a gate dielectric at sidewalls and bottom of the trench before filling the trench with the conductive material, the gate dielectric isolating the conductive material from the semiconductor substrate.

* * * * *